US009955601B2

(12) United States Patent
Premysler et al.

(10) Patent No.: US 9,955,601 B2
(45) Date of Patent: Apr. 24, 2018

(54) ELECTRICAL DEVICE FOR MOUNTING INSIDE A CABINET

(71) Applicant: RITTAL GMBH & CO. KG, Herborn (DE)

(72) Inventors: Ewgenij Premysler, Herborn (DE); Marco Deusing, Herborn (DE); Kurt-Michael Schaffer, Eckental (DE)

(73) Assignee: RITTAL GMBH & CO. KG, Herborn (DE)

( * ) Notice: Subject to any disclaimer, the term of this patent is extended or adjusted under 35 U.S.C. 154(b) by 0 days.

(21) Appl. No.: 15/252,662

(22) Filed: Aug. 31, 2016

(65) Prior Publication Data

US 2017/0064848 A1 Mar. 2, 2017

(30) Foreign Application Priority Data

Sep. 1, 2015 (DE) ........................ 10 2015 114 570

(51) Int. Cl.
*H05K 5/02* (2006.01)
*H01R 31/06* (2006.01)
*H05K 5/00* (2006.01)
*H01R 35/02* (2006.01)

(52) U.S. Cl.
CPC ......... *H05K 5/0247* (2013.01); *H01R 31/065* (2013.01); *H05K 5/0026* (2013.01); *H01R 35/025* (2013.01)

(58) Field of Classification Search
CPC .................................................. H05K 5/0247
See application file for complete search history.

(56) References Cited

U.S. PATENT DOCUMENTS

| 5,634,806 A * | 6/1997 | Hahn | H01R 27/00 |
| | | | 439/172 |
| 7,255,582 B1 | 8/2007 | Liao | |
| 2012/0238146 A1 | 9/2012 | Liao et al. | |

FOREIGN PATENT DOCUMENTS

| DE | 134824 A1 | 3/1979 |
| DE | 29622478 U1 | 9/1997 |
| DE | 20208338 U1 | 9/2002 |
| DE | 202004010287 U1 | 9/2004 |
| DE | 202005015971 U1 | 12/2005 |
| DE | 112010005080 T5 | 11/2012 |
| WO | WO-2014-018901 A2 | 1/2014 |

* cited by examiner

*Primary Examiner* — Jeremy C Norris
(74) *Attorney, Agent, or Firm* — Harness, Dickey & Pierce, P.L.C.

(57) ABSTRACT

The invention relates to an electrical device (1) for installation in the interior of an electrical enclosure that has at least one single- or multiple-pole plug (3) accommodated in a housing (2) of the device (1) to connect an electrical conductor having an easily accessible plug opening (6) via one side (4, 5) of the plug (3) wherein the at least one plug (3) has no less than two positions or orientations with respect to the housing (2).

11 Claims, 7 Drawing Sheets

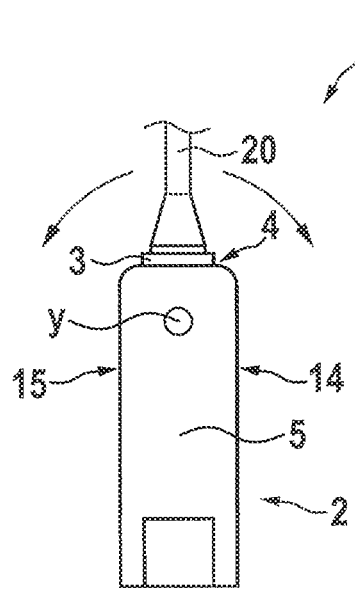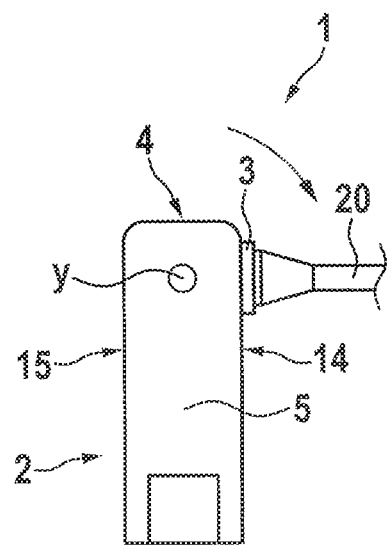
Fig. 5

ELECTRICAL DEVICE FOR MOUNTING INSIDE A CABINET

CROSS-REFERENCE TO RELATED APPLICATION

This application claims the benefit and priority of DE 10 2015 114 570.7, filed Sep. 1, 2015. The entire disclosure of the above application is incorporated herein by reference.

FIELD

The invention relates to an electrical device for installation in the interior of an electrical enclosure that has a single- or multi-pole connector integrated in a device housing for connecting an electrical conductor to a socket easily accessible via at least one side of the housing. An electrical device of this type is known, for example, from DE 296 22 478U1. DE 202 08 338 U1 shows a similar electrical device.

BACKGROUND

An electrical device of this type can be, for example, a light fixture for an electrical enclosure that is installed in the interior of an electrical enclosure. Given the customarily limited space in electrical enclosures, the electrical connection for the light must be located in such a way that creating a connection is possible from different directions. However, this is still frequently associated with awkward cable routing that can result in connectivity problems under the limited space conditions in electrical enclosures.

SUMMARY

An aspect of the invention is, therefore, to prepare an electrical device for installation in the interior of an electrical enclosure that also allows the device to be easily connected to an electrical power supply, even under conditions of limited space.

Accordingly, in the case of the proposed electrical device, the plug can assume at least two different positions, or orientations, with respect to the housing. The result is that, depending on the available existing space, the plug can be moved in such a way that the best accessibility of the plug for a connecting lead is achieved under the existing conditions.

The connector may be, for example, a male or a female recessed connector that is installed in one side of the electrical device.

Furthermore, the plug may be carried rotatably in the housing about an axis of rotation and connected to the housing by way of the axis of rotation. The result is that, in spite of the mobility of the plug in the housing, the plug is relieved of strain with respect to its electrical connection to an electrical power supply in the interior of the housing, for example, a circuit board and/or a voltage transformer.

The housing may have a corner at which a first and a second housing side merge with each other. The housing sides may merge with each other, for example, by way of an edge or be rounded. For this, provision can be made for the opening for the plug connector in a first position, or orientation, to face the first housing side and in a second position, or orientation, to face the second housing side. The two housing sides may be arranged, for example, at an angle of approximately 90° to each other so that the plug is optionally accessible from two directions, for example, from the side and from above, or from the front and from below, depending on how the better cable routing can be achieved.

The housing may also have two longitudinal sides, oppositely located and spaced in parallel, whereby the opening for the plug in turn faces the first longitudinal housing side in a first position and faces the second housing side in the second position. To do this, the plug can be pivoted approximately 180° about an axis of rotation extending in the longitudinal direction of the housing between the first and the second position, or orientation. In addition, the opening for the plug in an intermediate position, for example, in a position in which the plug is rotated by about 90° about the axis of rotation compared with the first and second position, or orientation, faces an additional longitudinal housing side that connects the two previously named housing sides.

The corner of the housing, or the housing, may have a recess that is accessible through an access on both housing (longitudinal) sides from outside the housing and in which the plug is accommodated.

It is further conceivable that the plug has a plug case with a closing side that, when the opening for the plug faces one of the two housing (longitudinal) sides, at least partially closes off access to the recess in the respective other case side to the outside. The result is that the interior of the case, which may also have the electrical power supply for the plug, is not accessible from outside, thus achieving protection against contact or against the undesirable incursion of contaminants and humidity.

The housing may be configured essentially as a rectangle, at least in one housing end face section in which the plug is accommodated in the housing. The plug may be in a first of two rotational positions offset to each other by about 90°, with its opening facing one end face of the housing, wherein the plug in a second of the two rotational positions offset by 90° to each other is facing one longitudinal side of the housing with the opening.

In the at least two different positions, or orientations, that the plug can assume with respect to the housing, one plug end face of a plug case may be aligned with that housing side which the plug faces with its opening.

Furthermore, the plug can assume an engaged position, at least in the not less than two different positions, or orientations, with respect to the housing.

Provision can be made regarding the electrical contact of the plug to a power supply for the plug to be connected to flexible conductors in the interior of the housing to a power supply. The plug can additionally be connected electrically in general to an electrically functional module. Sliding contacts can be provided in place of the flexible conductors, which permit the plug to be moved while retaining the electrical contact.

Furthermore, the electrical device can have one plug of the type previously described on each of two opposite sides of the housing. A continuous contact can be created between these plugs through the case. The two plugs may be identical or configured as one male and one female plug. The electrical device may, for example, have one plug at each of no less than two spaced apart positions of the housing.

BRIEF DESCRIPTION OF THE DRAWINGS

Additional details of the invention are explained with the aid of the following Figures.

FIG. 5 shows a schematic of still another embodiment of an electrical device, in which the plug can be pivoted about an axis of rotation extending in the longitudinal direction of the device;

DETAILED DESCRIPTION

Figure 1:
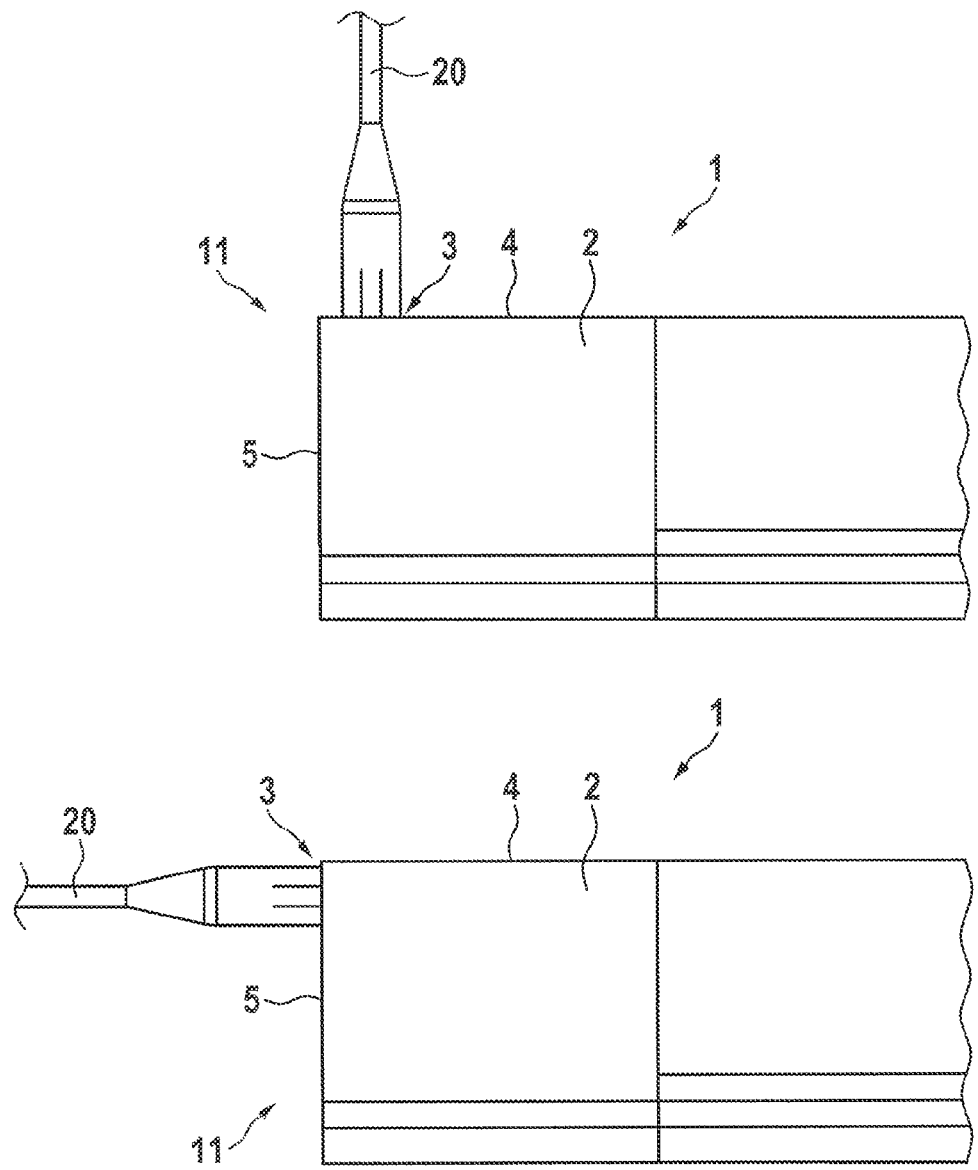
FIG. 1 shows schematically a first embodiment of an electrical device, in which the plug is located in two positions aligned perpendicular to each other.

FIG. 1 shows schematically an electrical device that is shown as an electrical enclosure light solely as an example, wherein, in a housing end face section 2 of the housing 2 of the electrical device 1, a plug 3 is accommodated in a corner area of the housing 2, which can be pivoted about an axis of rotation running perpendicular to the drawing plane and perpendicular to the vertical longitudinal sides of the housing 2. Depending on how a better cable routing can be achieved, the connecting cable 20 can either be fed to the electrical device from the longitudinal side 4, as shown in the drawing above, or from its end face 5 and the plug 3 aligned accordingly, facing either the end face 5 or the upper longitudinal side 4. The connecting cable 20 terminates in a male or female connector and the plug 3 has the corresponding female or male counterpart.

Figure 2:
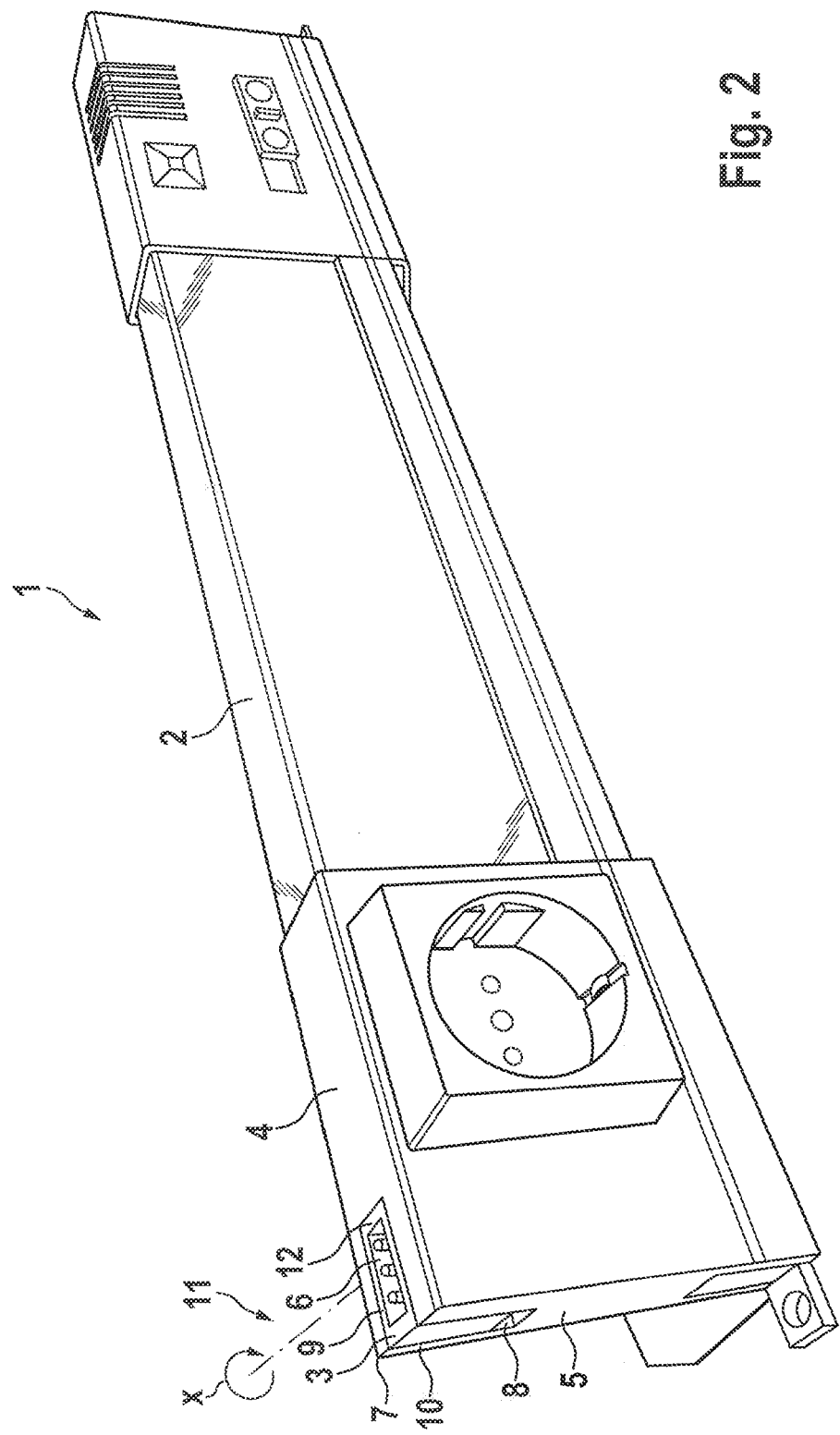
FIG. 2 shows a perspective view of a further embodiment of an electrical device configured as an electrical enclosure light.

FIG. 2 shows an embodiment in which the electrical device 1 is configured as an electrical enclosure light. In the housing end face section 11, which is configured essentially as a rectangle, with a longitudinal side 4 that transitions into an end face 5 over a corner area 7, a plug 3 is located in the corner area 7 that is recognizably configured as a male recessed plug. The plug 3 is aligned in such a way that its opening 6 is facing the longitudinal side 4 of the housing end face section 11. The recess 8 in which the plug 3 is housed is at least largely closed off at the end face 5 by a closing side 10 of the plug case 9, wherein the closing side 10 aligns evenly with the end face 5. Similarly, the plug end face 12, which has the plug opening 6, is essentially aligned with the longitudinal side 4 of the housing end face section 11. The recess 8 could also be a single-sided recess on the housing section 11 so that the plug forms the outer surface of the housing on one side.

Similarly to the embodiment from FIG. 1, the plug 3 can be pivoted about an axis of rotation X in such a way that it can be pivoted with its opening 6 between a first engaged position, shown in FIG. 2, and a second engaged position in which the plug opening 6 faces the end face 5, and the plug end face 12 is accordingly aligned, or approximately aligned, with the housing end face 5. Thus, the plug is accessible via the longitudinal side 4 of the housing 2, or optionally via the end face 5 of the housing 2.

Figure 3:
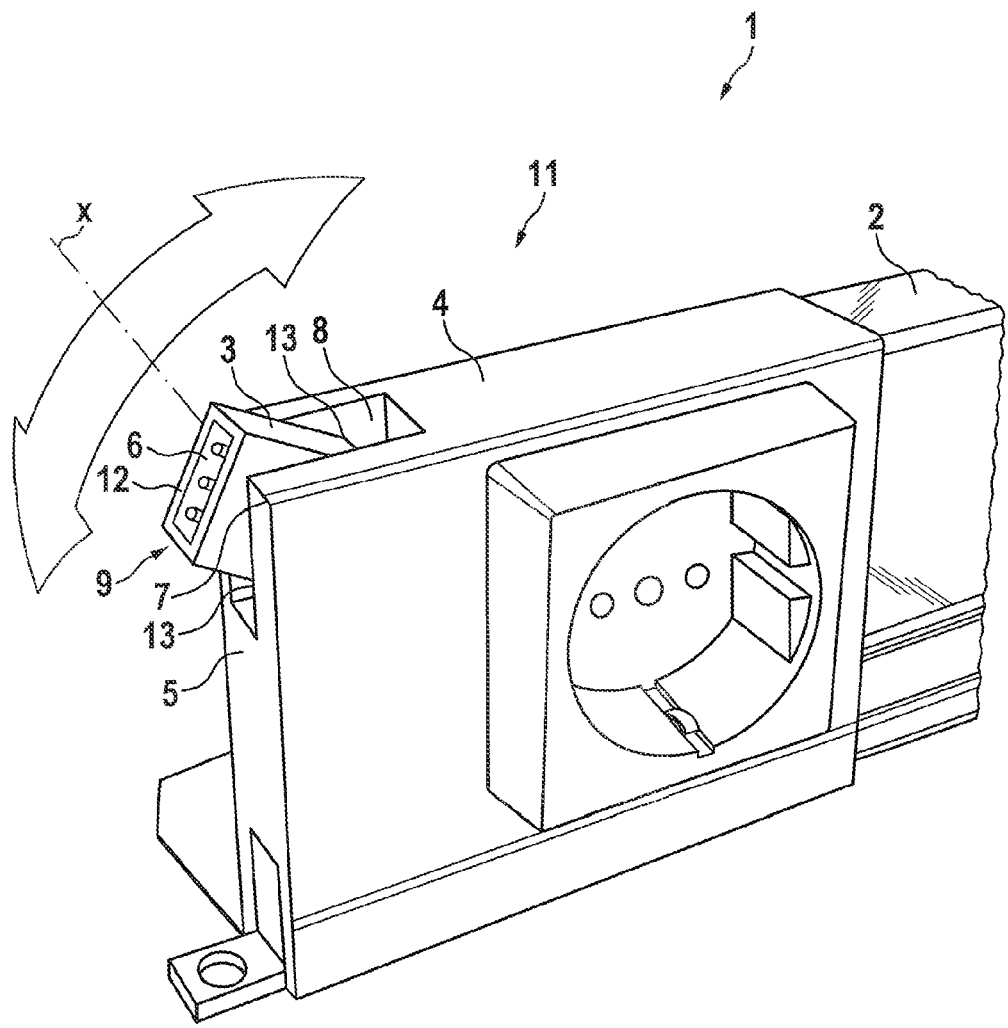
FIG. 3 shows a detail view of the embodiment from FIG. 2 in the area of the plug.

FIG. 3 shows an enlarged section of the embodiment from FIG. 2, wherein the plug 3 is shown in an intermediate position, in which the plug end face 12 is not aligned with either the longitudinal side 4 of the housing 2 or with the end face 5 of the housing. Provision can be made for the plug 3 to assume an engaged position in both of the aforementioned positions so that it is essentially freely moveable between the engaged positions, once it is released from these engaged positions. Depending on the application, it may also make sense for the plug in at least in one specific intermediate position to assume one engaged position between the aforementioned engaged positions. FIG. 3 illustrates that the plug 3 is accommodated in a recess 8 in the corner area 7 of the housing end face section 11 of the housing 2, which extends in a single piece between the longitudinal side 4 and the end face 5, where the dimensions of the recess 8 are selected such that the plug 3, in each of the two engaged positions mentioned, completely fills and thus closes off access 13 to the recess 8 on each of the sides 4, 5 that the plug end face 12 of the plug 3 faces respectively (c.f. FIG. 2).

Figure 4:
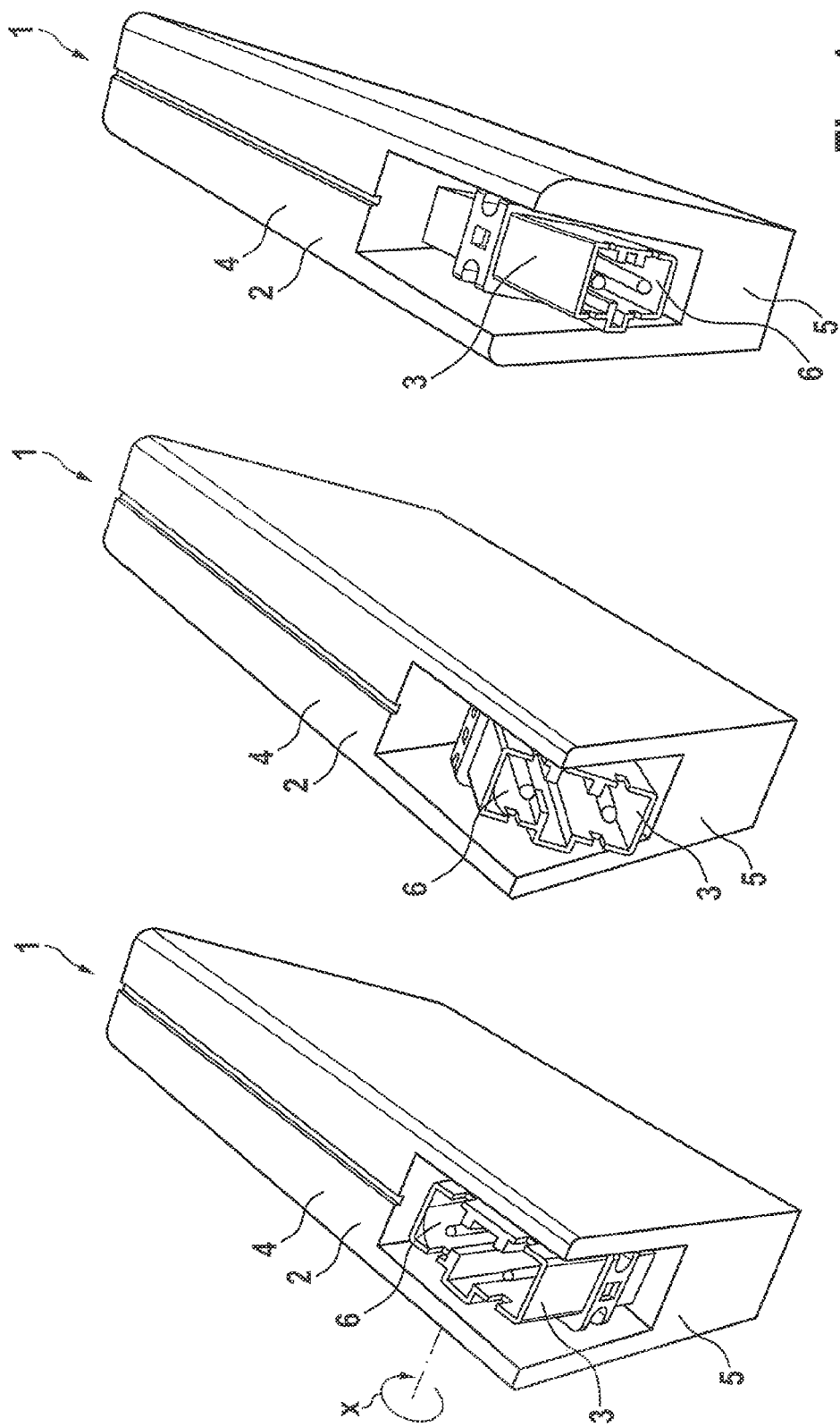
FIG. 4 shows a further embodiment of an electrical device, in which the plug is shown in three different positions as examples to illustrate its function in accordance with the invention.

FIG. 4 serves to illustrate the different positions that the plug 3 can assume in one embodiment of the electrical device 1 in accordance with the invention. Basically, the plug 3 can be pivoted about the axis of rotation X between the position that it assumes in the left-hand illustration and the position that it assumes in the right-hand illustration. Specifically, the plug 3 can assume each intermediate position. Provision can also be made for the orientation of the plug 3 shown in the left-hand illustration, in which the plug opening 6 faces the longitudinal side 4 of the housing 2, and the orientation shown in the right-hand illustration, in which the plug 3 faces the opening 6 of the end face 5 of the housing 2, to each have a engaged position.

A further embodiment of the electrical device 1 under the invention is illustrated schematically in FIG. 5. In contrast to the embodiments in the preceding Figures, this embodiment of the plug 3 can be pivoted about an axis of rotation Y which extends in the longitudinal direction of the electrical device 1. As in the previous embodiments, the electrical device 1 may be, for example an electrical enclosure light. The electrical device 1 is not, however, intended to be limited to electrical enclosure lights. The electrical device 1 is shown in a plan view of the front in FIG. 5.

The two illustrations in FIG. 5 show that the plug 3 can be pivoted by about 180° around the axis of rotation Y so that it is accessible in a first position for a connecting cable 20 via a first longitudinal side 4. In the lower illustration of FIG. 5 the position of the plug 3 is shown in which the plug 3 is accessible via one of two parallel spaced apart longitudinal sides 14, 15. Similarly to the positions of the plug 3 shown in the lower illustration of FIG. 5, the plug 3 can also be located in addition rotated by about 180° so that it is accessible via the further longitudinal side 15 of the two parallel spaced apart longitudinal sides 14, 15.

As shown in FIG. 5, this embodiment is particularly suitable for electrical devices 1 whose housing is, at least in sections, configured as a rectangle in a longitudinal section so that the housing 2 has the aforementioned two parallel spaced apart longitudinal sides 14, 15 and in addition a further longitudinal side 4 which joins the two parallel spaced apart longitudinal sides 14, 15 and is preferably arranged at a right angle to said sides.

The plug 3 can have an engaged position in the three aforementioned orientations in which it faces one of the longitudinal sides 4, 14, 15 respectively so that the plug 3 is accessible via the respective longitudinal side 4, 14, 15. Additionally, the plug 3 can also assume engaged positions in intermediate positions. The embodiment shown in FIG. 5 thus has a particularly high variability with respect to the direction in which the connecting cable 20 is fed.

Figure 6:
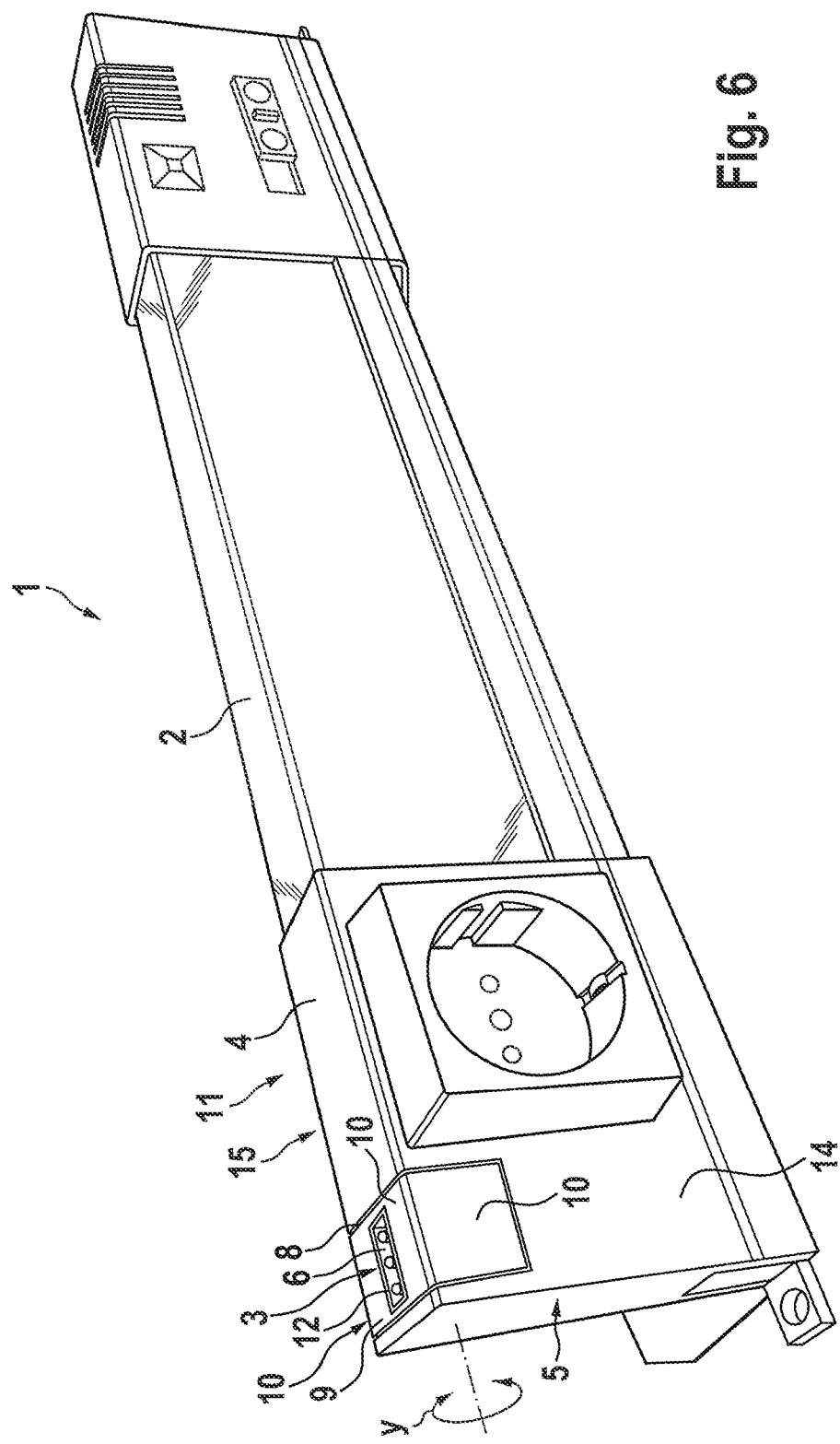
FIG. 6 shows in a perspective view still another embodiment of an electrical device configured as an electrical enclosure light.

FIG. 6 shows a concrete configuration of the embodiment shown schematically in FIG. 5. In this, the plug 3 is accommodated in a plug case 9 that is located in a housing end face section 11 of the electrical device 1, here configured as an electrical enclosure light. In the engaged position shown in FIG. 6, the opening 6 of the plug 3 is aligned facing the longitudinal side 4 so that the plug opening 6 is accessible for a connecting cable (not shown) via the longitudinal side 4. Furthermore, the plug case 9 is configured in such a way that it completely fills the recess 8 in which the plug case is accommodated and specifically its case sides 10 are arranged aligned with the respective longitudinal sides 4, 14, 15 of the housing end face section 11. The plug end face 12 is furthermore located aligned with the longitudinal side 4.

The plug case 3, similarly to the embodiment shown in FIG. 5, can be pivoted about an axis of rotation Y that extends in the longitudinal direction of the housing 2, or of the housing end face section 11.

Figure 7:
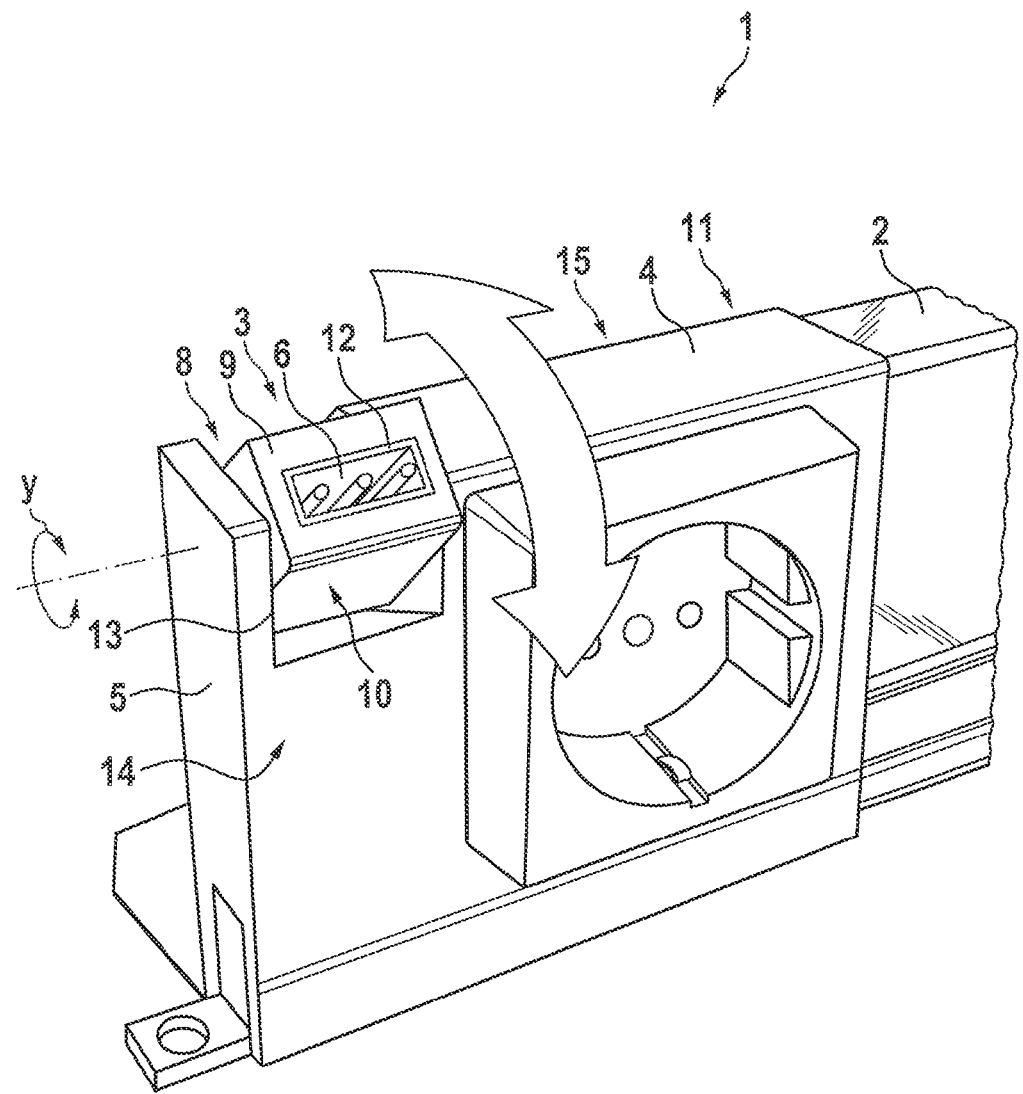
FIG. 7 shows a detail view of the embodiment from FIG. 6 in the area of the plug.

A detail from FIG. 6 is shown in FIG. 7 to illustrate a detail view in which the plug case 9 is rotated by about 45° from the position shown in FIG. 6. The plug case 9 can be rotated by about 45° between the two engaged positions in which the plug opening 6 is located once in the plane of the front longitudinal side 14 in the illustration from FIG. 7, and once in the plane of the opposite longitudinal side 15.

In the partially pivoted position, as shown in FIG. 7, it can be seen that the plug case 9 is accommodated in a recess 8 in the housing end face section 11, where the comparison with FIG. 6 shows that the dimensions of the plug case 9 and the recess 8 are matched exactly to one another so that the plug case, at least in the engaged position shown in FIG. 6, completely fills the recess so that the visible surfaces of the plug case are aligned with the longitudinal sides 4, 14, 15 of the housing end face section 11.

The features of the invention disclosed in the foregoing description, in the drawings and in the claims may be essential both individually as well as in any optional combination for the realization of the invention.

What is claimed:

1. An electrical device for installation in the interior of an electrical enclosure that has at least one single- or multi-pole plug accommodated in a housing of the device for connecting an electrical conductor to a plug opening easily accessible via one side of the housing, comprising wherein the at least one plug can assume no less than two different positions or orientations with respect to the housing, wherein the housing has a housing corner where a first and a second housing side merge, wherein the plug opening of the plug faces the first housing side in a first position or orientation, and wherein the opening of the plug faces the second housing side in a second position or orientation, and wherein the housing has a recess which is accessible from a respective access on both housing sides from the exterior of the housing and in which the plug is accommodated, and in which the plug has a plug case and a closing side, which, when the opening of the plug faces one of the two housing sides, at least partially closes off the access to the recess in the respective other housing side to the outside.

2. The electrical device of claim 1, in which the plug can be pivoted about at least one axis of rotation in the housing and is connected to the housing via the axis of rotation.

3. The electrical device of claim 1, in which the corner of the housing has a recess that is accessible via an access on both sides of the housing from outside the housing and in which the plug is accommodated.

4. The electrical device of claim 1, in which the housing is configured essentially rectangular at least in a housing end face section in which the plug is accommodated in the housing, wherein the plug, in a first of two rotational positions offset to each other by 90°, faces one end face of the housing with its plug opening and wherein the plug, in a second of the two rotational positions offset to each other by 90°, faces a longitudinal side of the housing with its plug opening.

5. The electrical device of claim 1, in which the housing has two longitudinal housing sides, spaced parallel to and opposite each other, wherein the plug opening of the plug in a first engaged position or orientation faces a first of the two longitudinal housing sides and in a second engaged position or orientation faces a second of the two longitudinal housing sides.

6. The electrical device of claim 5, in which the plug can be pivoted by 180° about an axis of rotation extending in the longitudinal direction of the housing between the first and the second engaged position or orientation.

7. The electrical device of claim 6, wherein the plug opening of the plug in an intermediate position, in which the plug, compared with the first and the second engaged position or orientation, is rotated by 90° about the axis of rotation, faces an additional housing longitudinal side which connects the two housing longitudinal sides.

8. The electrical device of claim 1, wherein in one of the two different positions or orientations that the plug can assume with respect to the housing, a plug end face of a plug case is aligned with that housing side which the plug faces with its plug opening.

9. The electrical device of claim 1, wherein the plug assumes an engaged position at least in the no less than the two different positions or orientations with respect to the housing.

10. The electrical device of claim 1, wherein the plug is connected in the interior of the housing via flexible conductors or via an intermediate PCB to a power supply.

11. The electrical device of claim 1, which has a plug in at least two spaced apart positions of the housing.

* * * * *